United States Patent
Feng et al.

(10) Patent No.: US 10,529,920 B1
(45) Date of Patent: Jan. 7, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ya-Sheng Feng, Tainan (TW); Hung-Chan Lin, Tainan (TW); Yu-Ping Wang, Taoyuan (TW); Yu-Chun Chen, Kaohsiung (TW); Chiu-Jung Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/056,551

(22) Filed: Aug. 7, 2018

(30) Foreign Application Priority Data

Jul. 9, 2018 (CN) .......................... 2018 1 0743150

(51) Int. Cl.
*H01L 45/00* (2006.01)
*H01L 43/12* (2006.01)
*H01L 43/02* (2006.01)
*H01L 27/22* (2006.01)

(52) U.S. Cl.
CPC ............. *H01L 43/12* (2013.01); *H01L 27/222* (2013.01); *H01L 43/02* (2013.01); *H01L 45/1666* (2013.01)

(58) Field of Classification Search
None
See application file for complete search history.

(56) References Cited

U.S. PATENT DOCUMENTS

| 9,818,935 B2 | 11/2017 | Chuang et al. |
| 9,905,282 B1 | 2/2018 | Yi et al. |
| 2012/0241882 A1* | 9/2012 | Moon ...................... H01L 43/12 |
| | | 257/421 |
| 2017/0069835 A1* | 3/2017 | Sonoda ................... H01L 43/12 |
| 2017/0084667 A1* | 3/2017 | Lim ....................... H01L 27/222 |

* cited by examiner

Primary Examiner — Cheung Lee
(74) Attorney, Agent, or Firm — Winston Hsu

(57) ABSTRACT

A method for fabricating semiconductor device includes the steps of: forming a first inter-metal dielectric (IMD) layer on a substrate; forming a magnetic tunneling junction (MTJ) on the first IMD layer; forming a liner on the MTJ and the first IMD layer; removing part of the liner to form a spacer adjacent to the MTJ; and forming a second IMD layer on the first IMD layer.

13 Claims, 9 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a first inter-metal dielectric (IMD) layer on a substrate; forming a magnetic tunneling junction (MTJ) on the first IMD layer; forming a liner on the MTJ and the first IMD layer; removing part of the liner to form a spacer adjacent to the MTJ; and forming a second IMD layer on the first IMD layer.

According to another aspect of the present invention, a semiconductor device includes: a first inter-metal dielectric (IMD) layer on a substrate; a magnetic tunneling junction (MTJ) on the first IMD layer; a metal interconnection under the MTJ and in the first IMD layer, wherein the metal interconnection comprises a first slanted sidewall and a second slanted sidewall; and a spacer around the MTJ and on the first slanted sidewall and the second slanted sidewall.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
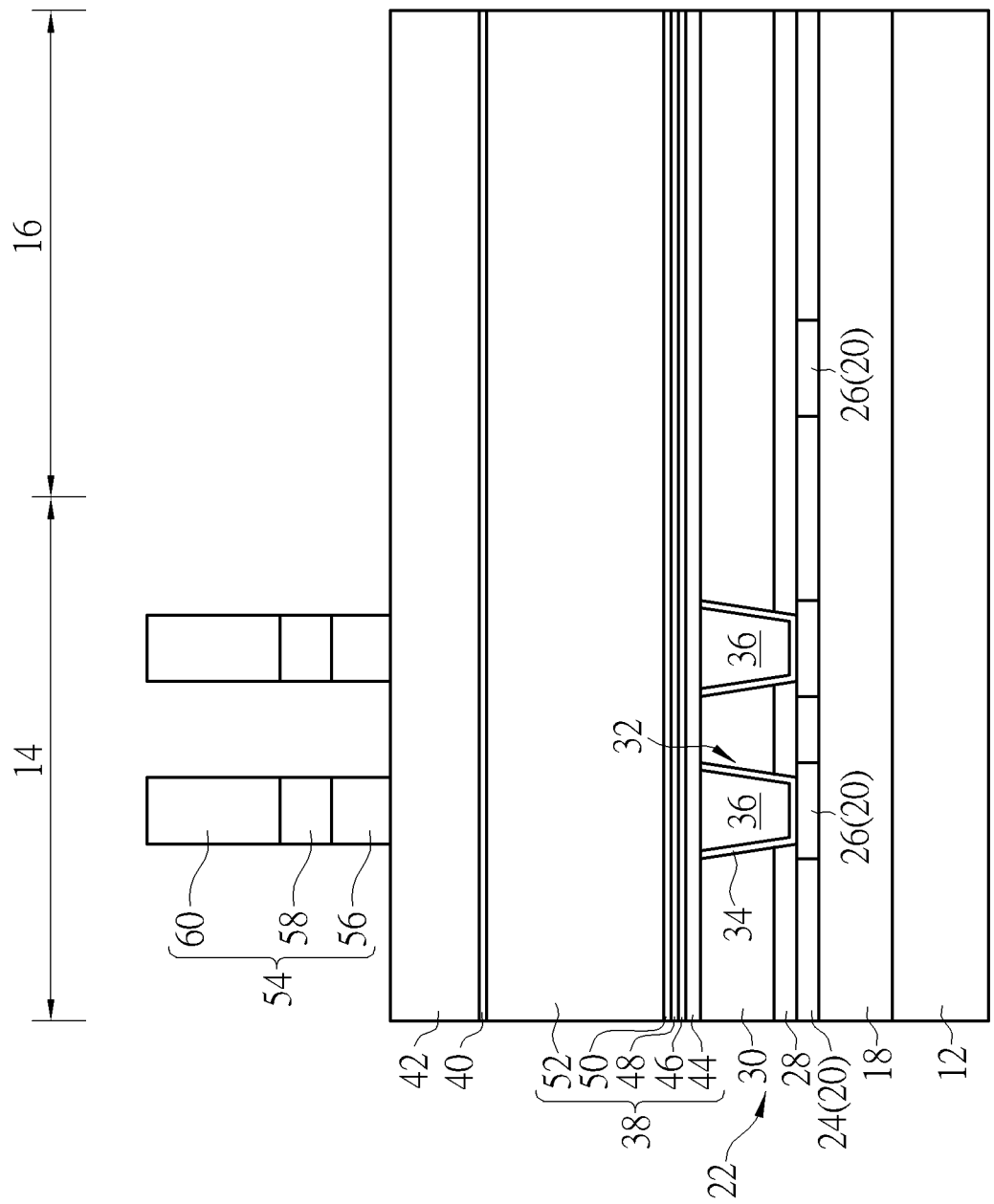
FIGS. 1-5 illustrate a method for fabricating a MRAM device according to an embodiment of the present invention.

Referring to FIGS. 1-5, FIGS. 1-5 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor 46 and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide ($AlO_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
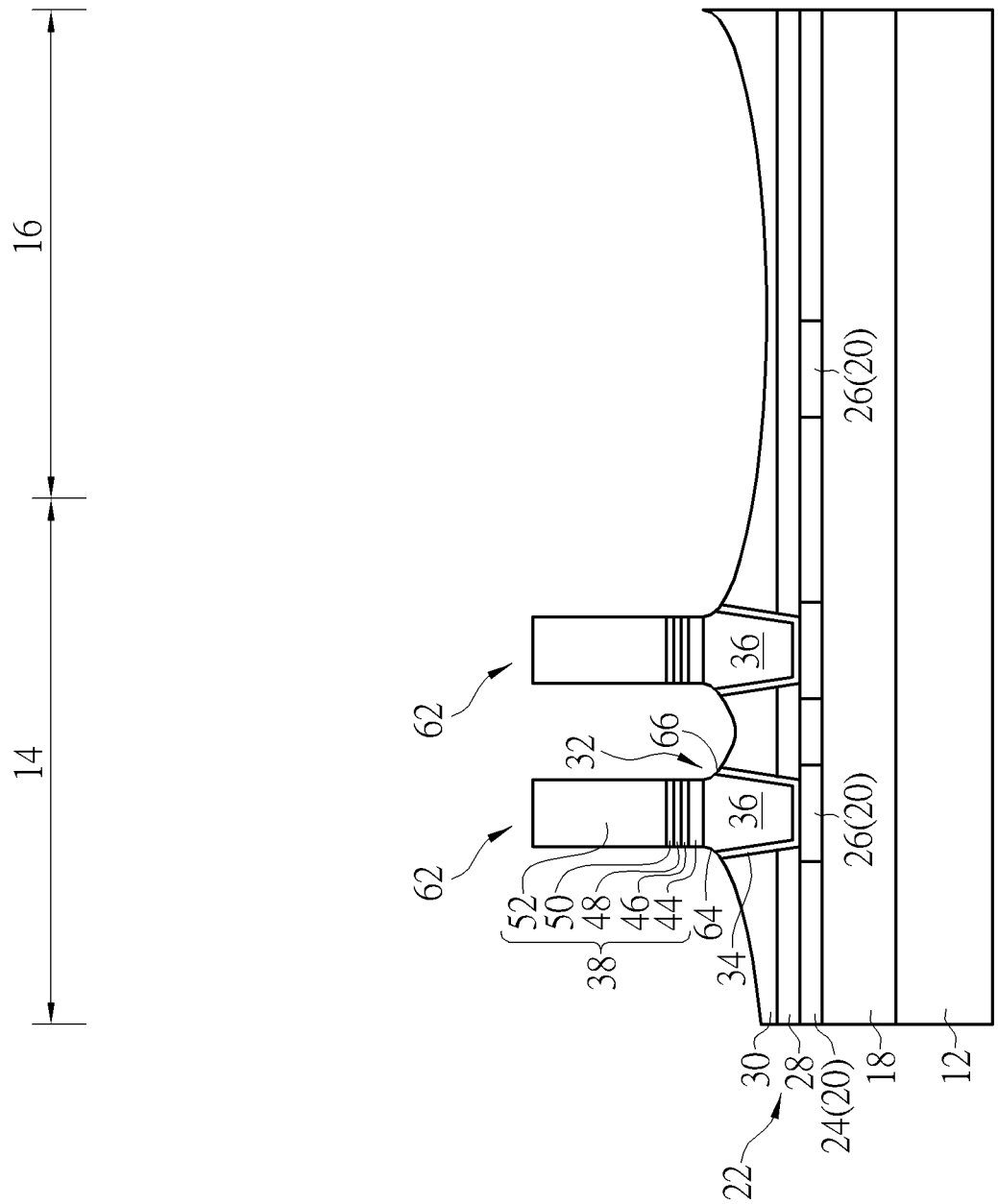

Next, as shown in FIG. 2, one or more etching process is conducted by using the patterned mask 54 as mask to remove part of the cap layers 40, 42, part of the MTJ stack 38, and part of the IMD layer 30 to form MTJs 62 on the MTJ region 14. Preferably, the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJs 62, in which each of the first slanted sidewall 64 and the second slanted sidewall 66 could further include a curve (or curved surface) or a planar surface.

Figure 3:
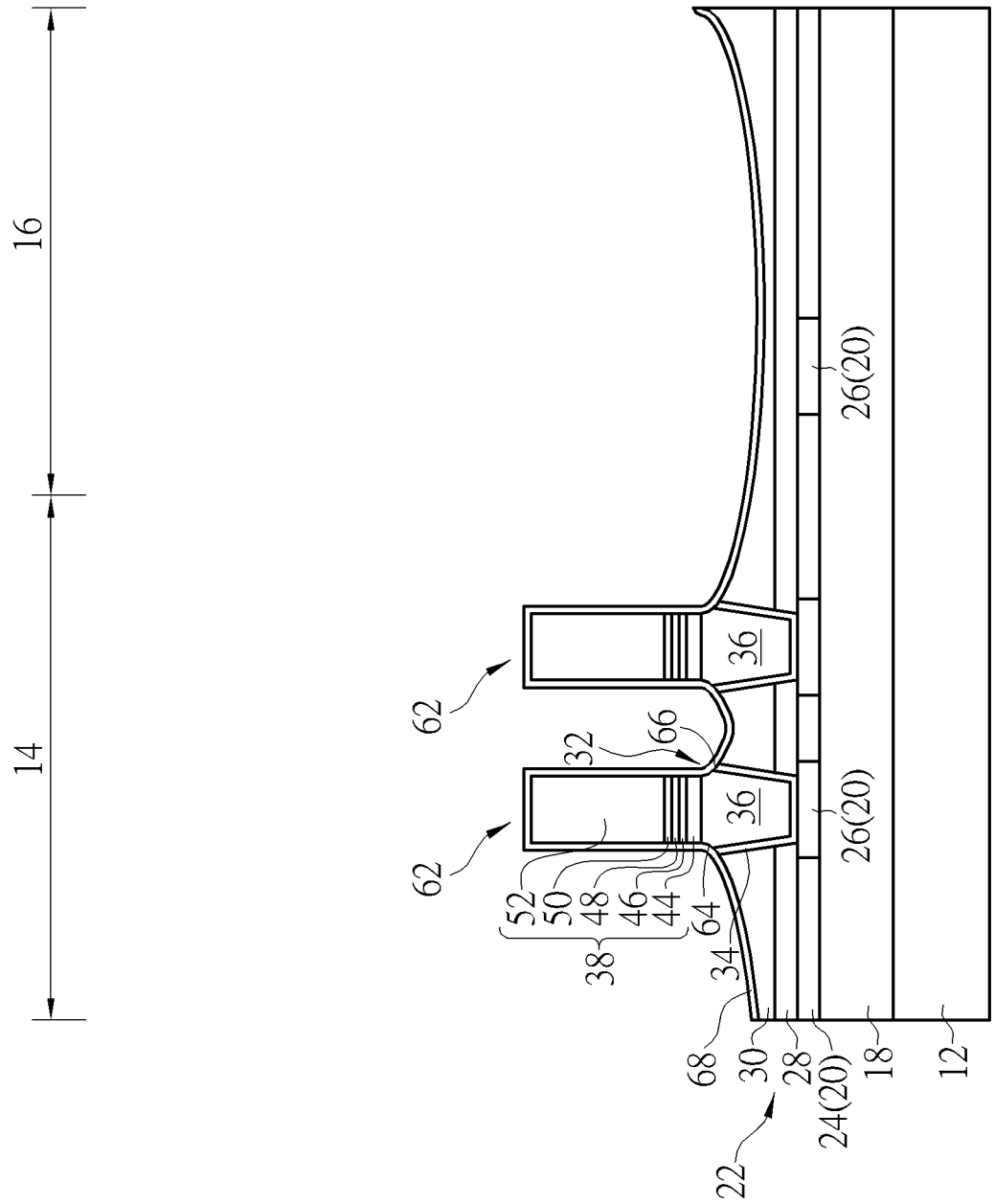

Next, as shown in FIG. 3, a liner 68 is formed on the MTJs 62 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
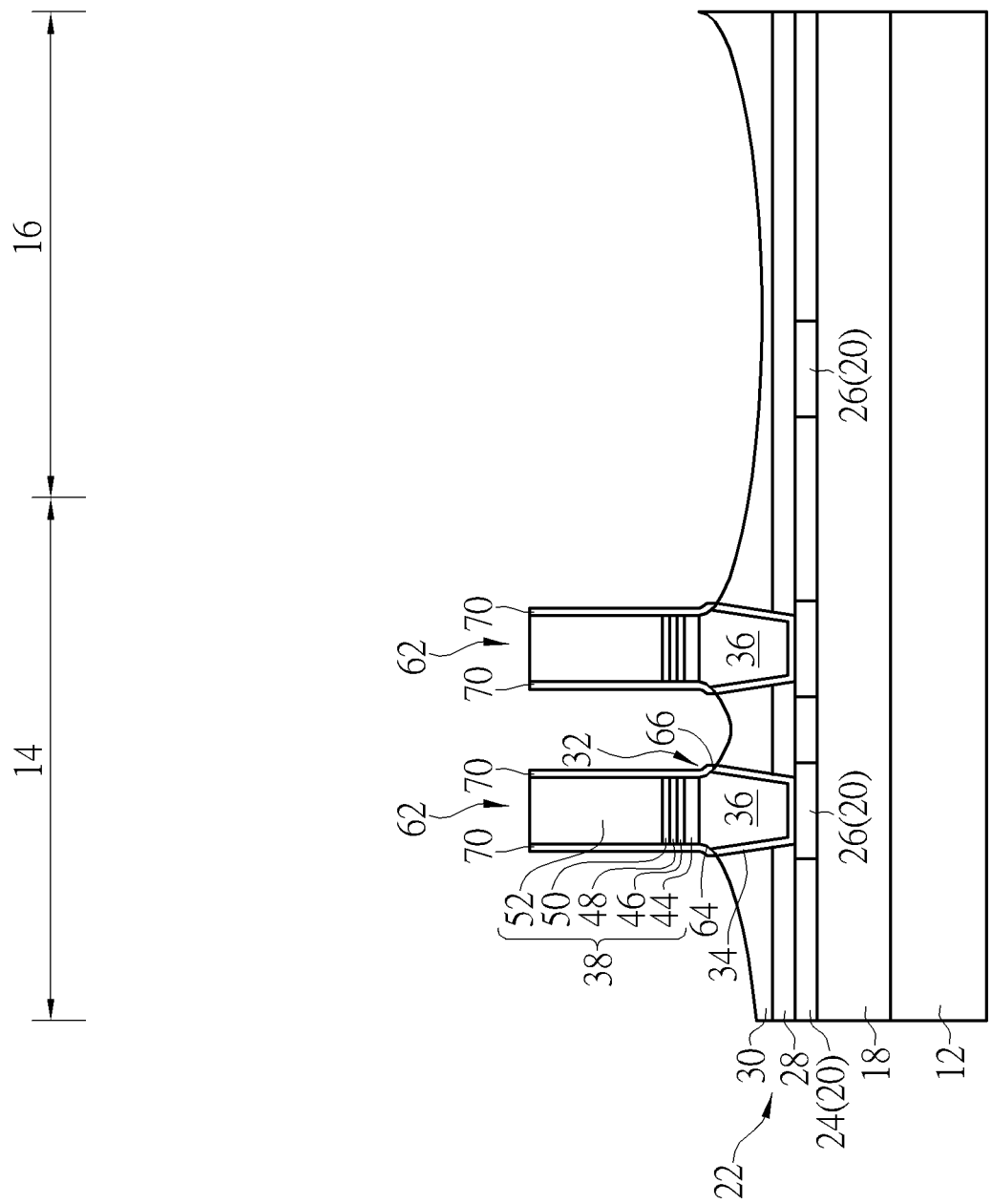

Next, as shown in FIG. 4, an etching process is conducted to remove part of the liner 68 to form a spacer 70 adjacent to each of the MTJs 62, in which the spacer 70 is disposed on the sidewalls of each of the MTJs 62 and at the same time covering and contacting the first slanted sidewalls 64 and second slanted sidewalls 66 of the metal interconnections 32 directly.

Figure 5:
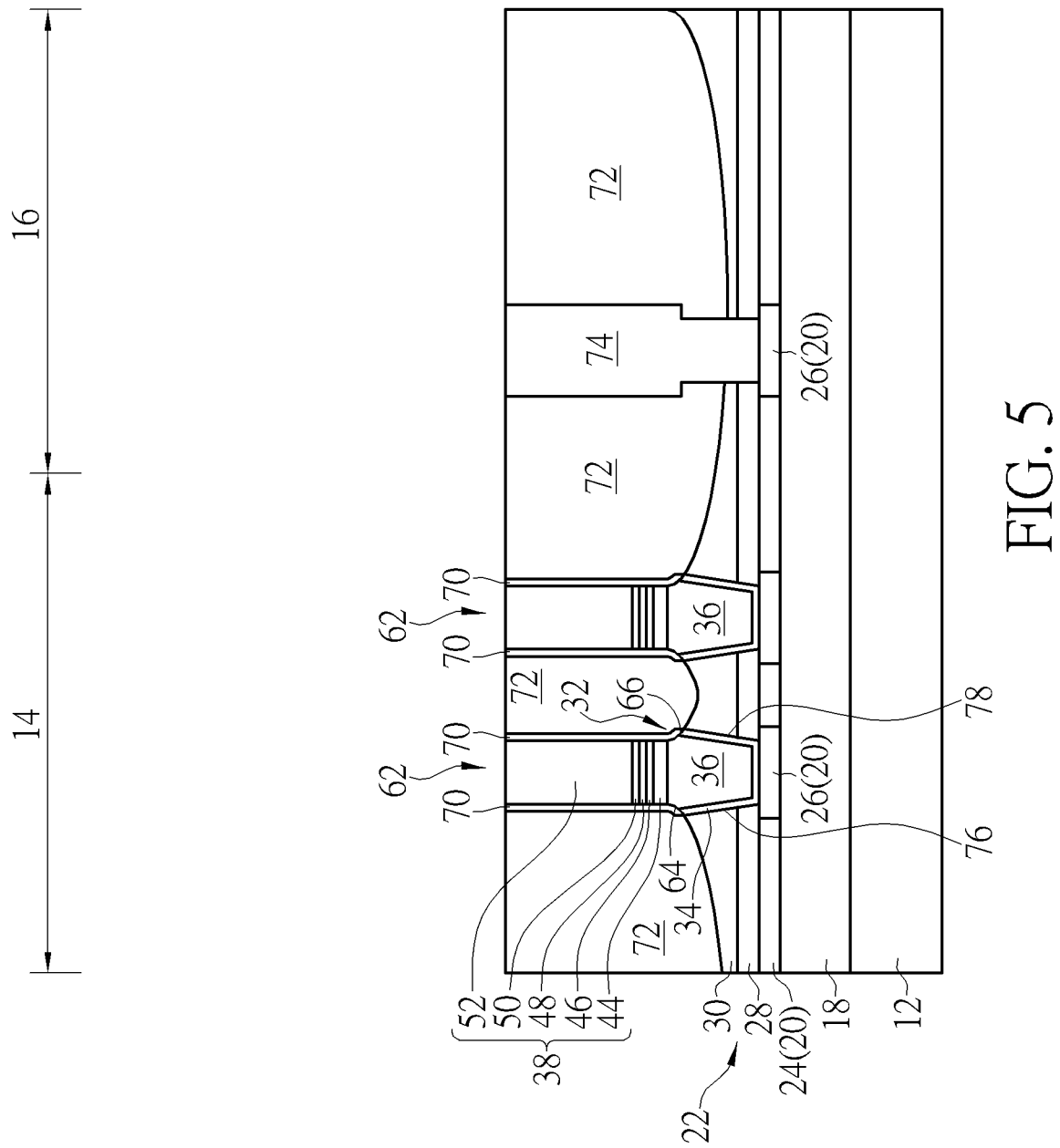

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with the top surface of the MTJs 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer and metal layer to form a contact plug 74 in the contact hole electrically connecting the metal interconnection 26. This completes the fabrication of a semiconductor device according to an embodiment of the present invention.

Referring again to FIG. 5, FIG. 5 illustrates a structural view of a semiconductor device according to an embodiment of the present invention. As shown in FIG. 5, the semiconductor device preferably includes at least a MTJ 62 disposed on the IMD layer 30, a metal interconnection 32 disposed under the MTJ 62 and within the IMD layer 30, and a spacer 70 around the MTJ 62, in which the metal interconnection 32 includes a first slanted sidewall 64 and a second slanted sidewall 66 and the spacer 70 is standing on and directly contacting the first slanted sidewall 64 and the second slanted sidewall 66.

Viewing from a more detailed perspective, the metal interconnection 32 not only includes the first slanted sidewall 64 and the second slanted sidewall 66 but also include a third slanted sidewall 76 connecting the first slanted sidewall 64 and a fourth slanted sidewall 78 connecting the second slanted sidewall 66, in which the first slanted sidewall 64 and the third slanted sidewall 76 together constitute a V-shape and the second slanted sidewall 66 and the fourth slanted sidewall 78 also constitute another V-shape. It should be noted that even though the outer sidewalls of the spacer 70 are aligned with the third slanted sidewall 76 and the fourth slanted sidewall 78 in this embodiment, according to another embodiment of the present invention, the outer sidewalls of the spacer 70 could also not align with the third slanted sidewall 76 and the fourth slanted sidewall 78. For instance, the outer sidewalls of the spacer 70 could be retracted inward to align with inner sidewalls of the barrier layer 34 or extended outward to contact the IMD layer 30 adjacent to two sides of the metal interconnections 32 directly, which are all within the scope of the present invention.

Figure 6:
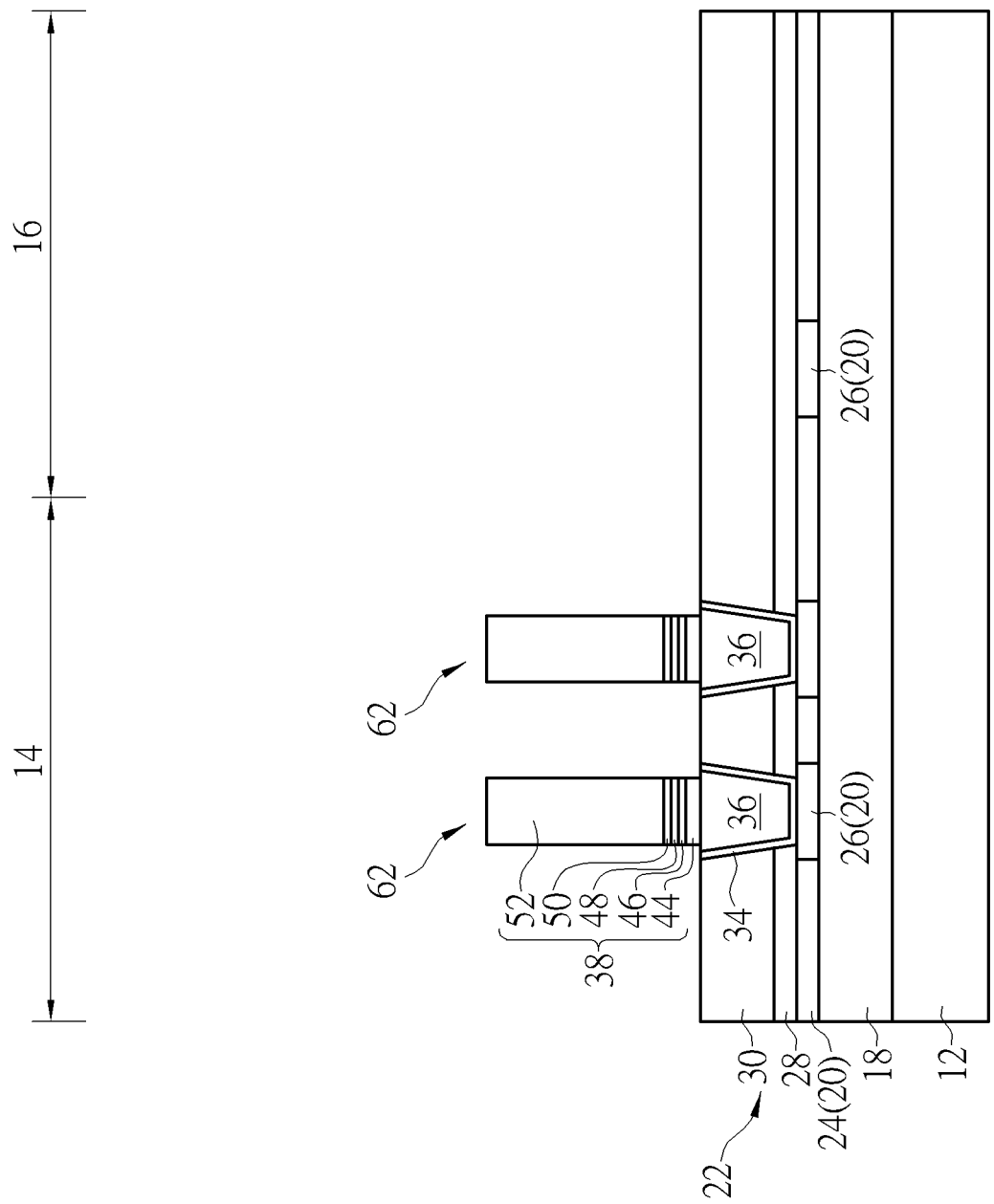
FIGS. 6-9 illustrate a method for fabricating a MRAM device according to an embodiment of the present invention.

Referring to FIGS. 6-9, FIGS. 6-9 illustrate a method for fabricating a MRAM device according to an embodiment of the present invention. As shown in FIG. 6, a MTJ stack 38, cap layers 40, 42, and a patterned mask 54 could be formed on the metal interconnect structure 22 as shown in FIG. 1, and a RIE process is conducted to remove part of the cap layers 40, 42 and part of the MTJ stack 38 to form MTJs 62 and top on the surface of the IMD layer 30. It should be noted that since part of the MTJ stack 38 was removed by a RIE process instead of a IBE process before exposing the surface of the IMD layer 30, the surface of the IMD layer 30 exposed afterwards is preferably a planar surface instead of a curved surface.

Figure 7:
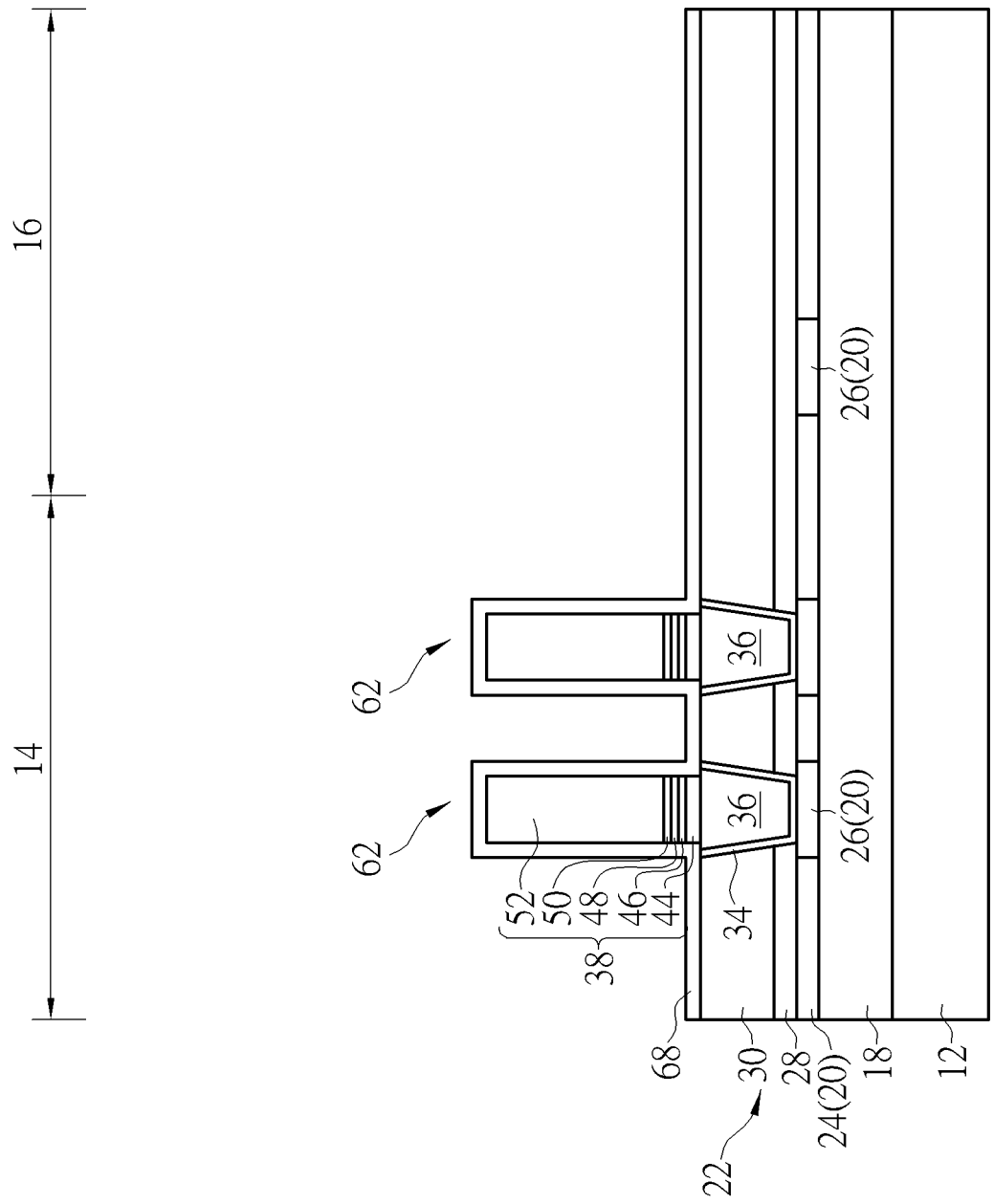

Next, as shown in FIG. 7, a liner 68 is formed on the MTJs 62 to cover the surface of the IMD layer 30. Similar to the aforementioned embodiment, the liner 68 is preferably made of silicon oxide, but could also be made of other dielectric material including but not limited to for example silicon oxide, silicon oxynitride, or silicon carbon nitride.

Figure 8:
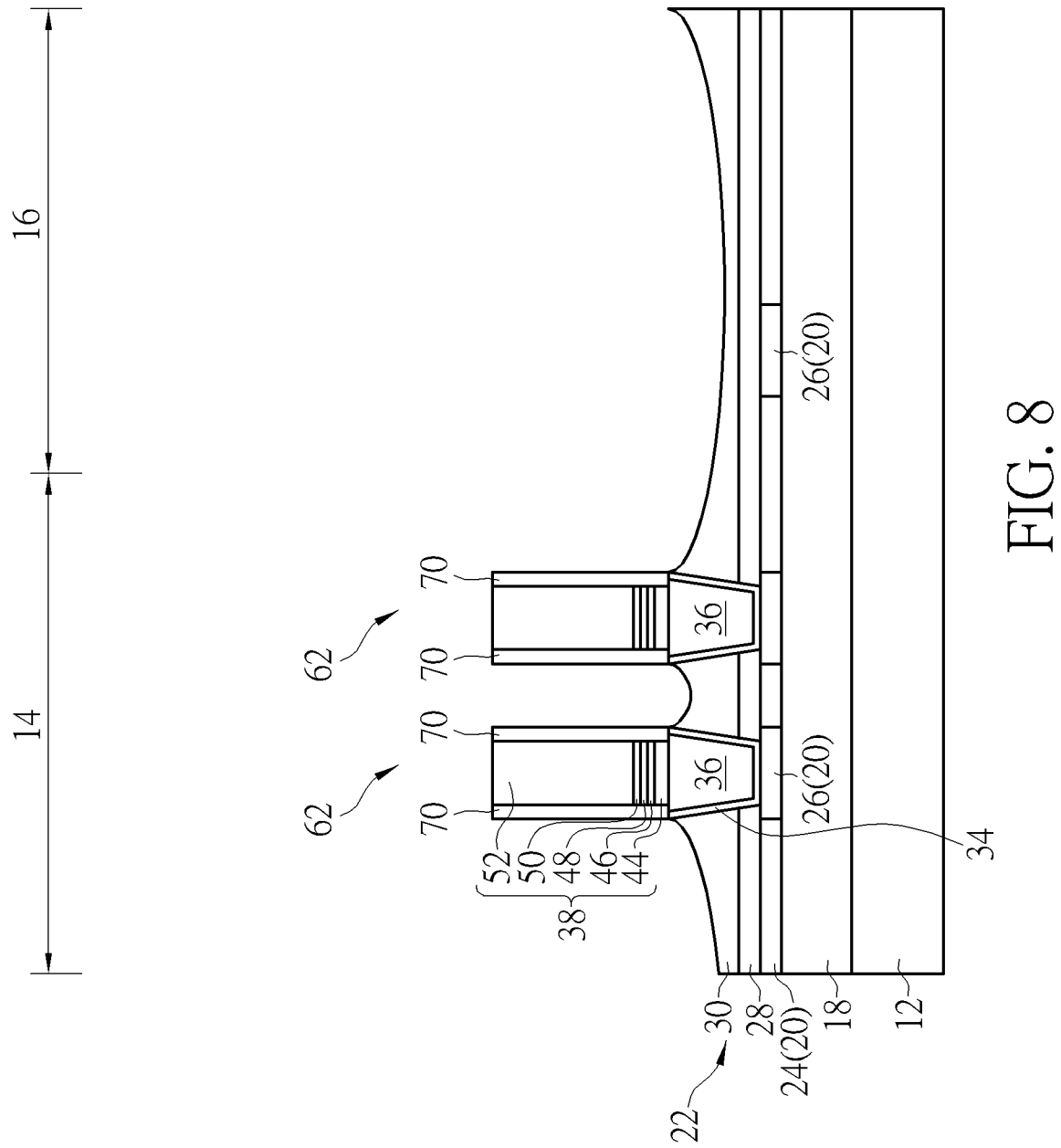

Next, as shown in FIG. 8, an etching process is conducted to remove part of the liner 68 to form a spacer 70 adjacent to each of the MTJs 62. It should be noted the etching process conducted at this stage not only removes the liner 68 disposed on the surface of the IMD layer 30 but also removes part of the IMD layer 30 at the same time so that the surface of the remaining IMD layer 30 reveals a curve or curved profile. Moreover, since none of the metal interconnections 32 is removed to form slanted sidewalls in this embodiment, the bottom surface of the spacer 70 is preferably even with the bottom surface of the MTJs 62.

Figure 9:
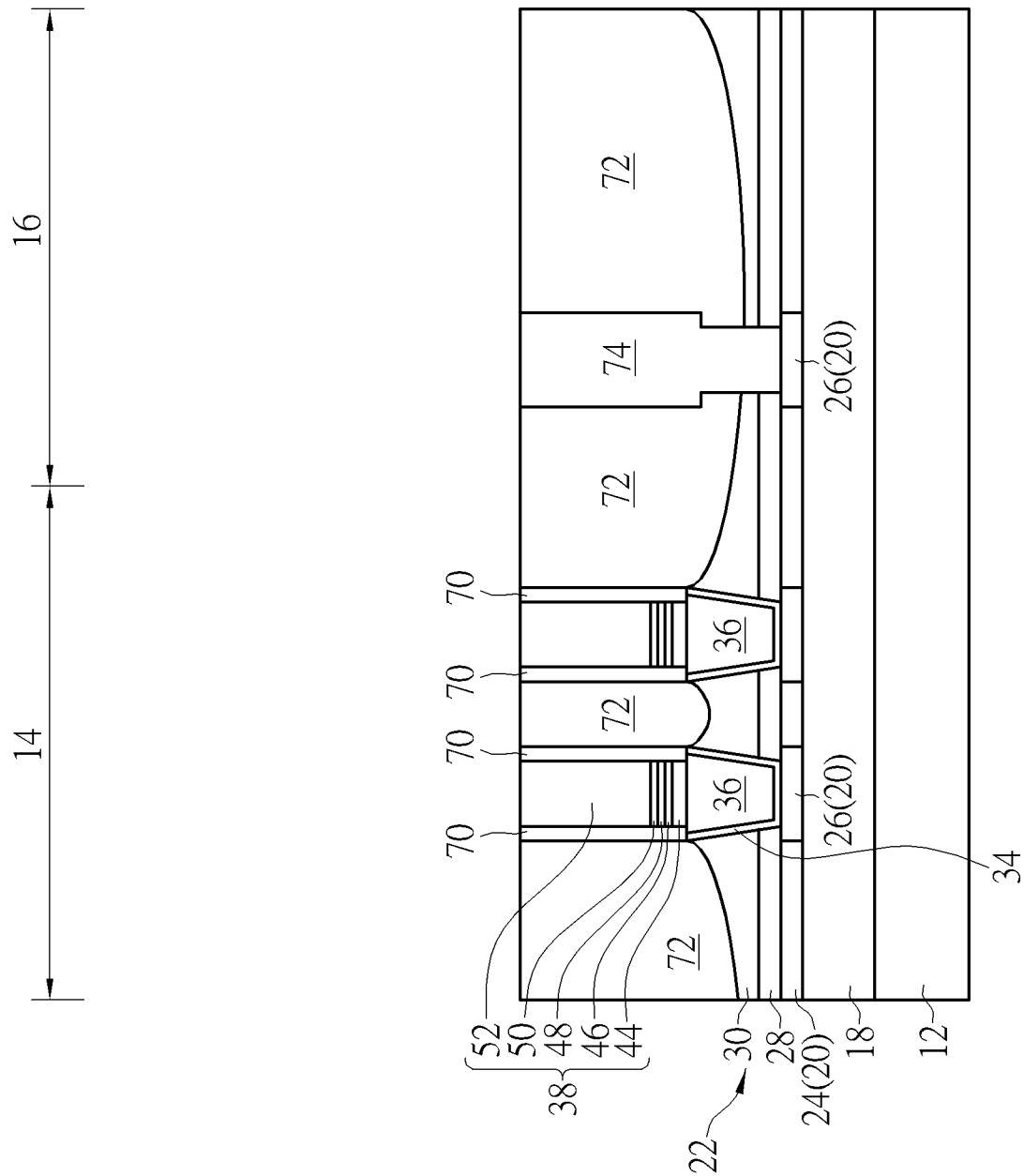

Next, as shown in FIG. 9, it would then be desirable to follow the process conducted in FIG. 5 by forming another IMD layer 72 on the MTJ region 14 and logic region 16, conducting a contact plug fabrication process to remove part of the IMD layer 72 and then forming a contact plug 74 to electrically connect the metal interconnection 26 underneath. This completes the fabrication of a semiconductor device according to an embodiment of the present invention.

Overall, the present invention first forms at least a MTJ on an IMD layer, forms a liner to cover the MTJ and the IMD layer, removes part of the liner to form a spacer around sidewalls of the MTJ, forms another IMD layer around the MTJ, and then conducts a contact plug formation process to form contact plug on the logic region. In contrast to the conventional art of conducting an extra etching process to open the liner when contact hole and contact plug are formed on the logic region, the present invention preferably removes part of the liner on the logic region before contact holes are formed on the logic region so that an extra etching process could eliminated and overall cost of the process could be reduced substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first inter-metal dielectric (IMD) layer on a substrate;
   forming a metal interconnection in the first IMD layer;
   forming a magnetic tunneling junction (MTJ) stack on the first IMD layer and the metal interconnection;
   removing the MTJ stack, the first IMD layer, and the metal interconnection to form a MTJ directly on the metal interconnection, wherein a top surface of the first IMD layer adjacent to two sides of the MTJ comprises a curve
   forming a liner on the MTJ and the first IMD layer;
   removing part of the liner to form a spacer adjacent to the MTJ, wherein a sidewall of the spacer is aligned with a sidewall of the metal interconnection; and
   forming a second IMD layer on the first IMD layer.

2. The method of claim 1, further comprising performing an ion beam etching (IBE) process to remove part of the MTJ stack.

3. The method of claim 2, further comprising performing the IBE process to remove part of the first IMD layer and part of the metal interconnection so that a top surface of the first IMD layer is lower than a top surface of the metal interconnection.

4. The method of claim 3, wherein a top surface of the first IMD layer comprises a curve.

5. The method of claim 3, further comprising performing the IBE process to remove part of the metal interconnection for forming a first slanted sidewall and a second slanted sidewall.

6. The method of claim 5, further comprising forming the liner on the MTJ, the first slanted sidewall, and the second slanted sidewall.

7. The method of claim 6, further comprising removing part of the liner to form the spacer on the first slanted sidewall and the second slanted sidewall.

8. A semiconductor device, comprising:
   a first inter-metal dielectric (IMD) layer on a substrate;
   a magnetic tunneling junction (MTJ) on the first IMD layer;
   a metal interconnection under the MTJ and in the first IMD layer, wherein the metal interconnection comprises a first slanted sidewall and a second slanted sidewall; and
   a spacer around the MTJ and on the first slanted sidewall and the second slanted sidewall, wherein a sidewall of the spacer is aligned with a sidewall of the metal interconnection and the spacer contacts the first slanted sidewall and the second slanted sidewall directly.

9. The semiconductor device of claim 8, wherein a top surface of the first IMD layer comprises a curve.

10. The semiconductor device of claim 8, further comprising a second IMD layer on the first IMD layer and around the spacer.

11. The semiconductor device of claim 8, wherein the metal interconnection comprises a third slanted sidewall connected to the first slanted sidewall and a fourth slanted sidewall connected to the second slanted sidewall.

12. The semiconductor device of claim 11, wherein the first slanted sidewall and the third slanted sidewall comprise a V-shape.

13. The semiconductor device of claim 11, wherein the second slanted sidewall and the fourth slanted sidewall comprise a V-shape.

* * * * *